(12) United States Patent
Lin et al.

(10) Patent No.: US 6,713,349 B2
(45) Date of Patent: Mar. 30, 2004

(54) METHOD FOR FABRICATING A SPLIT GATE FLASH MEMORY CELL

(75) Inventors: Chi-Hui Lin, Taipei (TW); Chung-Lin Huang, Taichung (TW)

(73) Assignee: Nanya Technology Corporation, Taoyuan (TW)

(*) Notice: Subject to any disclaimer, the term of this patent is extended or adjusted under 35 U.S.C. 154(b) by 5 days.

(21) Appl. No.: 10/426,347

(22) Filed: Apr. 30, 2003

(65) Prior Publication Data

US 2004/0043563 A1 Mar. 4, 2004

(30) Foreign Application Priority Data

Aug. 30, 2002 (TW) .................................. 91119768 A

(51) Int. Cl.[7] .......................................... H01L 21/336
(52) U.S. Cl. ........................ 438/257; 438/211; 438/267; 438/596
(58) Field of Search ................................ 438/257–267, 438/201, 211, 588, 593, 594, 595, 596

(56) References Cited

U.S. PATENT DOCUMENTS

| 5,891,775 | A | * | 4/1999 | Hisamune | .................. | 438/267 |
|---|---|---|---|---|---|---|
| 6,096,603 | A | * | 8/2000 | Chang et al. | ................ | 438/258 |
| 6,180,461 | B1 | * | 1/2001 | Ogura | ........................ | 438/266 |
| 6,436,764 | B1 | * | 8/2002 | Hsieh | ........................ | 438/257 |
| 6,482,700 | B2 | * | 11/2002 | Chen et al. | .................. | 438/267 |
| 6,525,371 | B2 | * | 2/2003 | Johnson et al. | ............. | 257/317 |
| 6,562,673 | B2 | * | 5/2003 | Lin | ............................ | 438/211 |
| 6,589,842 | B2 | * | 7/2003 | Huang | ........................ | 438/261 |

* cited by examiner

Primary Examiner—Amir Zarabian
Assistant Examiner—Khanh B. Duong
(74) Attorney, Agent, or Firm—Nelson A. Quintero

(57) ABSTRACT

A method for fabricating a split gate flash memory cell. First, a substrate having a doped region covered by a first conductive layer is provided. A floating gate and a first insulating layer are successively formed over the substrate on both sides of the first conductive layer. Thereafter, a conformable second insulating layer and a conformable second conductive layer are successively formed on the substrate and the first insulating layer, and then a third insulating layer is formed thereon. The third insulating layer and the second conductive layer are successively etched back to expose the second insulating layer. The third insulating layer is removed using a cap layer formed on the second conductive layer as a mask to form an opening. Finally, the second conductive layer under the opening is removed to form a control gate underlying the cap layer.

25 Claims, 19 Drawing Sheets

METHOD FOR FABRICATING A SPLIT GATE FLASH MEMORY CELL

BACKGROUND OF THE INVENTION

1. Field of the Invention

The invention relates to a method for fabricating a semiconductor device, and more particularly to a method for fabricating a split gate flash memory cell to increase the integration of integrated circuits (ICs).

2. Description of the Related Art

Non-volatile memory, such as flash memory, stores data regardless of electrical power supplied, and reads and writes data by controlling a threshold voltage of a control gate. Conventionally, flash memory includes a floating gate and a control gate. The floating gate stores charge and the control gate reads and writes data. In addition, the floating gate is located under the control gate and is not connected to external circuit, and the control gate connects to the word line. One of the advantages of flash memory is its capacity for block-by-block memory erasure. Furthermore, the speed of memory erasure is fast, and normally takes just 1 to 2 seconds for the complete removal of a whole block of memory. Therefore, in recent years, it is widely applied for consumer electronics devices, such as digital cameras, mobile phones, personal stereos, and laptops.

FIG. 1 is a cross-section showing a conventional split gate flash memory cell. The memory cell includes a silicon substrate 100 having a source region S and a drain region D. A source line 110 is disposed on the source region S. A floating gate 104 and silicon oxide layers 102, 106 are disposed over the substrate 100 outside the source line 110, and the floating gate 104 is insulated from the source line 110 by a spacer 108. A control gate 114 with an "arc" profile formed by spacer method is disposed over the substrate 100 outside the floating gate 104 and insulated by a silicon oxide layer 113. In addition, the bit line 120 disposed in the contact hole 119 is insulated from the control gate (word line) 114 by the interlayer dielectric (ILD) 118 and the spacer 116.

However, in such a flash memory cell, it is difficult to control the thickness of the control gate 114 with an "arc" profile. That is, the critical dimension (CD) of the control gate 114 cannot be precisely controlled. Moreover, since an interval L between the bit line 120 and the control gate 114 must prevent the failure due to circuit short, the line width of the bit line 120 is limited. As a result, the integration of integrated circuits is limited and the device is more difficult to fabricate when the size of device is reduced.

SUMMARY OF THE INVENTION

Accordingly, an object of the invention is to provide a novel method for fabricating a split gate flash memory cell to increase the integration of ICs by decreasing the interval between the word line and the bit line.

Another object of the invention is to provide a novel method for fabricating a split gate flash memory cell to precisely control the critical dimension (CD) of the control gate and reduce its resistance.

According to one aspect, the invention provides a method for fabricating a split gate flash memory cell. First, a substrate having a doped region and a first conductive layer formed thereover is provided. Next, a floating gate and a first insulating layer are successively formed over the substrate on both sides of the first conductive layer, wherein the floating gate is insulated from the first conductive layer and the substrate. Next, a conformable second insulating layer and a conformable second conductive layer are successively formed on the substrate and the first insulating layer, and a third insulating layer is then formed thereon. Next, the third insulating layer is etched back to expose the second conductive layer. Subsequently, the exposed second conductive layer is etched back to expose the second insulating layer. Next, a cap layer is formed on the exposed second conductive layer. Thereafter, the third insulating layer is removed to form an opening and expose the second conductive layer. Next, the second conductive layer under the opening is removed to expose the second insulating layer and form a control gate composed of the remaining second conductive layer underlying the cap layer. Next, the second insulating layer under the opening is removed to expose the substrate and form a contact hole. Finally, a metal layer is formed in the contact hole and insulated from the control gate.

Moreover, the profile of the control gate is rectangular. In addition, the metal layer serves as a bit line and the first conductive layer serves as a source line.

According to another aspect., the invention provides a method for fabricating a vertical split gate flash memory cell. First, a substrate having a doped region and a first conductive layer formed over the doped region is provided. Next, a floating gate and a first insulating layer are successively formed over the substrate on both sides of the first conductive layer, wherein the floating gate is insulated from the first conductive layer and the substrate. Next, a conformable second insulating layer, a conformable second conductive layer, and a conformable third conductive layer are successively formed on the substrate and the first insulating layer, and then a third insulating layer is formed thereon. Next, the third insulating layer is etched back to expose the third conductive layer. Subsequently, the exposed third and second conductive layers are etched back to expose the second insulating layer. Next, a cap layer is formed on the exposed third and second conductive layers. Thereafter, the third insulating layer is removed to form an opening and expose the third conductive layer. Next, the third and second conductive layers under the opening are removed to expose the second insulating layer and form a control gate composed of the remaining second conductive layer underlying the cap layer. Next, the second insulating layer under the opening is removed to expose the substrate and form a contact hole. Finally, a metal layer is formed in the contact hole and insulated from the control gate.

Moreover, the profile of the control gate is rectangular. In addition, the metal layer serves as a bit line and the first conductive layer serves as a source line.

DESCRIPTION OF THE DRAWINGS

For a better understanding of the present invention, reference is made to a detailed description to be read in conjunction with the accompanying drawings, in which.

DETAILED DESCRIPTION OF THE INVENTION

Figure 1:
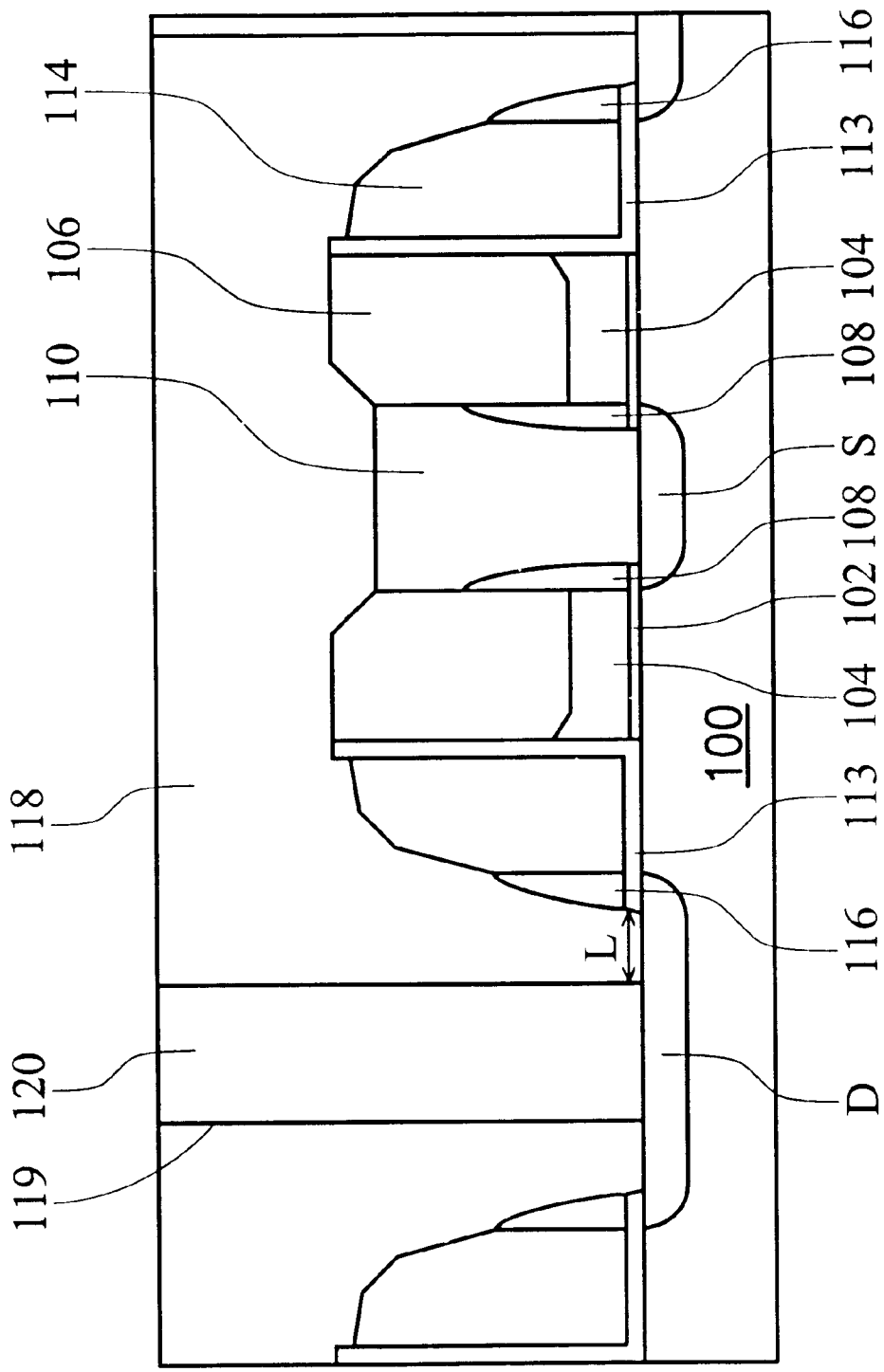
FIG. 1 is a cross-section showing a conventional split gate flash memory cell.
Figure 2:
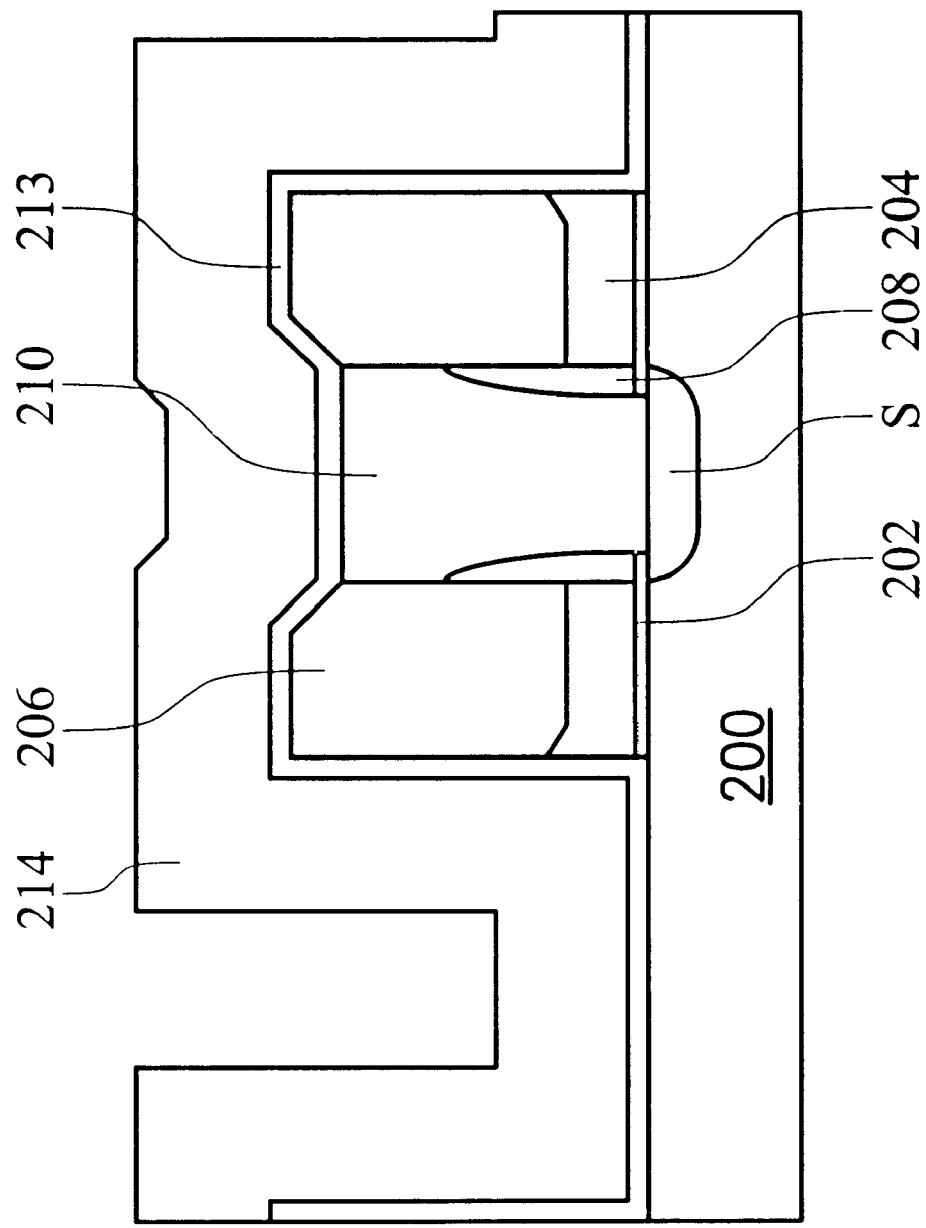
FIGS. 2–10 are cross-sections showing a method for fabricating a split gate flash memory cell according to the first embodiment of the present invention.

FIGS. 2–10 are cross-sections showing a method for fabricating a split gate flash memory cell of the first embodiment of the present invention. In FIG. 2, first, a substrate 200, such as a silicon substrate, having a doped region S serving as a source region, is provided. A first conductive layer 210, such as polysilicon, is formed over the doped region S and serves as a source line to electrically connect to the doped region S. Next, a floating gate 204, such as polysilicon, and a first insulating layer 206, such as silicon oxide formed by tetraethyl orthosilicate (TEOS), are successively formed on the substrate 200 on both sides of the source line 210. The floating gate 204 is respectively insulated from the source line 210 and substrate 200 by the silicon oxide layer 202 and spacer 208. Thereafter, a conformable second insulating layer 213 and a conformable conductive layer 214 are successively deposited on the substrate 200 and the first insulating layer 206 by conventional deposition, such as chemical vapor deposition (CVD). In the invention, the second insulating layer 213 can be high temperature oxide with a thickness of about 100~500 Å. Moreover, the second conductive layer 214 can be polysilicon with a thickness of about 800~1700 Å.

Figure 3:
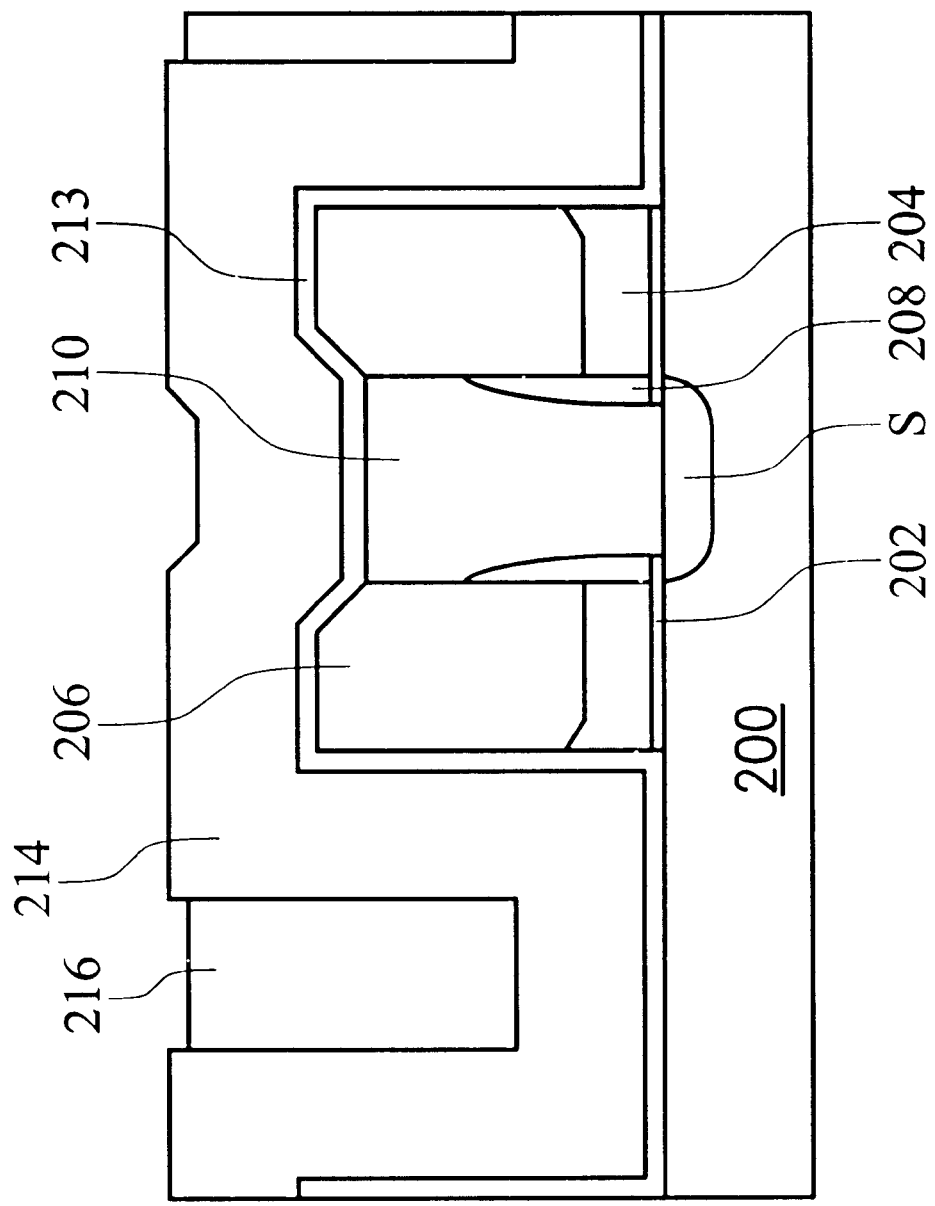

Next, in FIG. 3, a third insulating layer 216, such as borosilicate glass (BSG) is deposited on the second conductive layer 214. The third insulating layer 216 has a thickness of about 2000~4000 Å. Subsequently, the third insulating layer 216 is etched back by dry etching to expose the second conductive layer 214.

Figure 4:
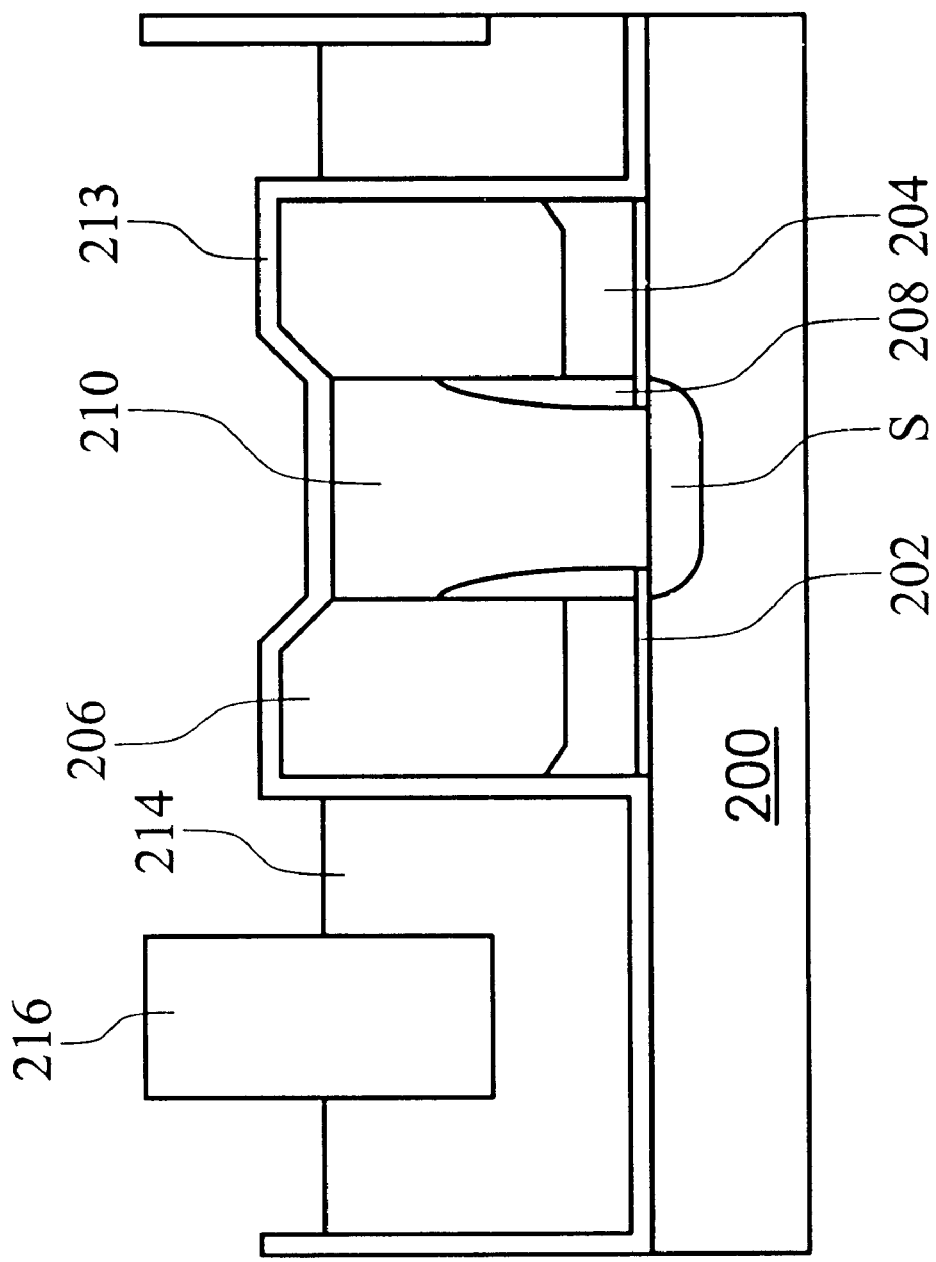

Next, in FIG. 4, the exposed second conductive layer 214 is etched back to expose the second insulating layer 213 using the remaining third insulating layer 216 as a hard mask. Subsequently, the second conductive layer 214 is overetched to lower its top surface below the second insulating layer 213 with a step height of about 1000~1500 Å.

Figure 5:
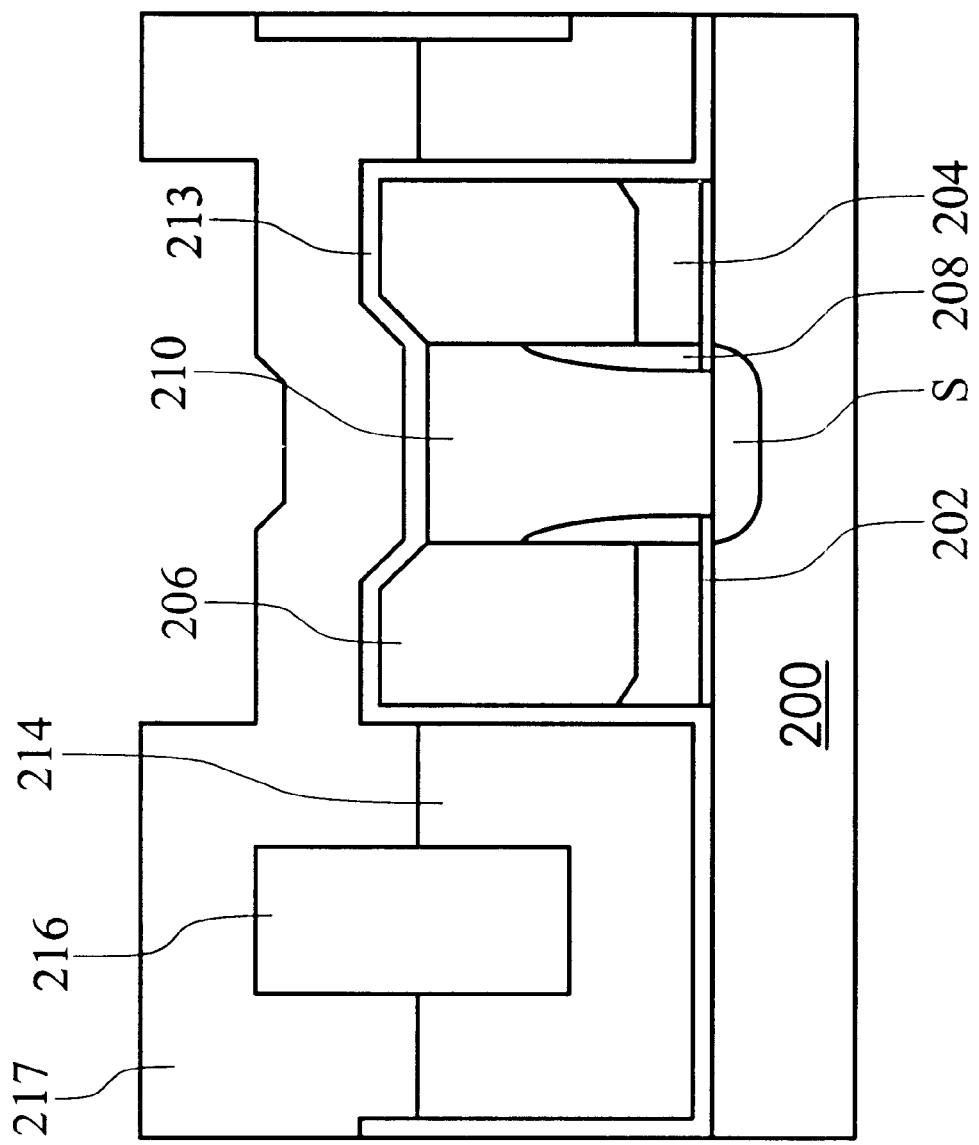

Next, in FIG. 5, a mask layer 217 is deposited by CVD on the exposed second conductive layer 214 and second insulating layer 213. In the invention, the mask layer 217 can be silicon nitride with a thickness of about 1200~1700 Å. In addition, the mask layer 217 deposited on the exposed second conductive layer 214 is thicker at about 2500~3400 Å.

Figure 6:
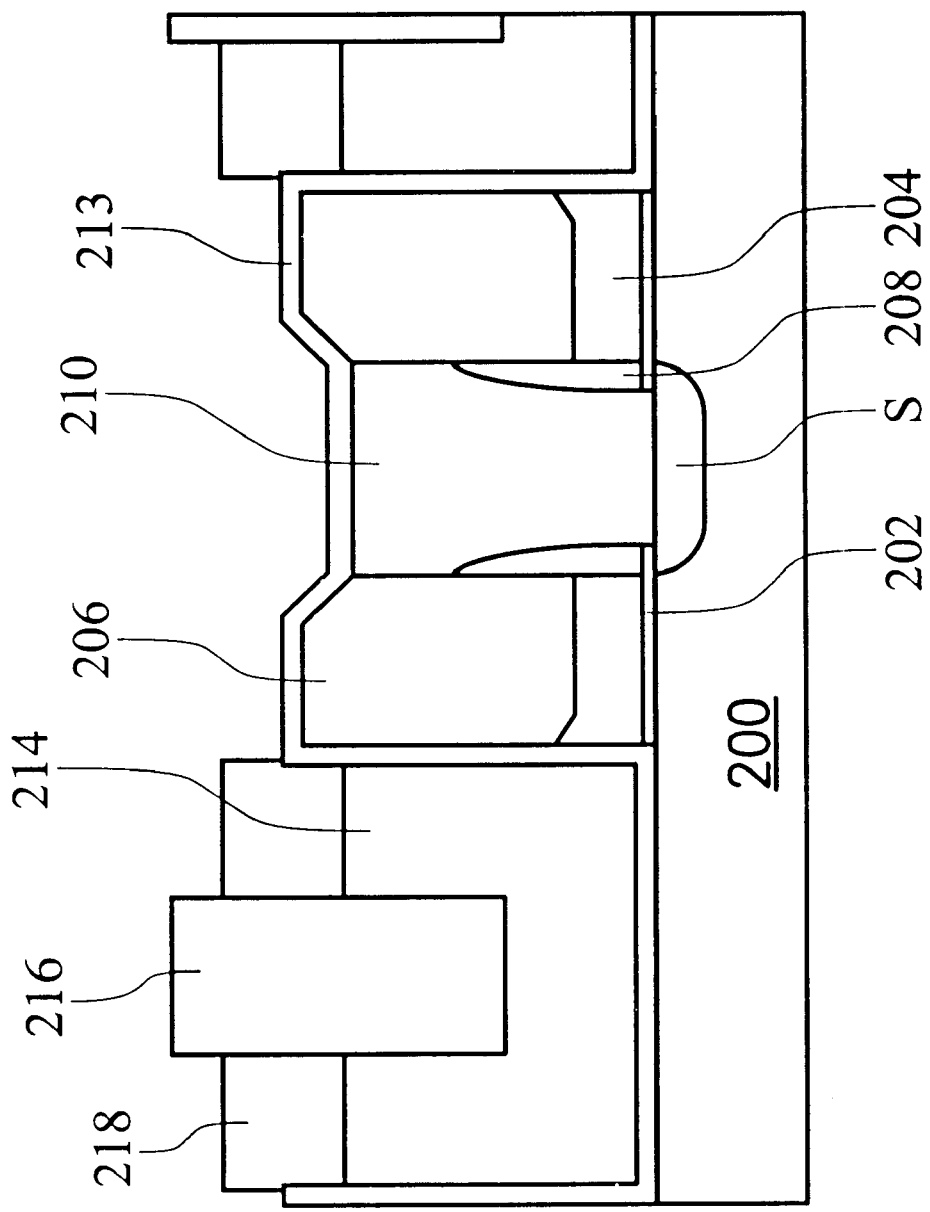

Next, in FIG. 6, the mask layer 217 is etched back to expose the remaining third insulating layer 216 and the second insulating layer 213 to form a cap layer 218 on the second conductive layer 214.

Figure 7:
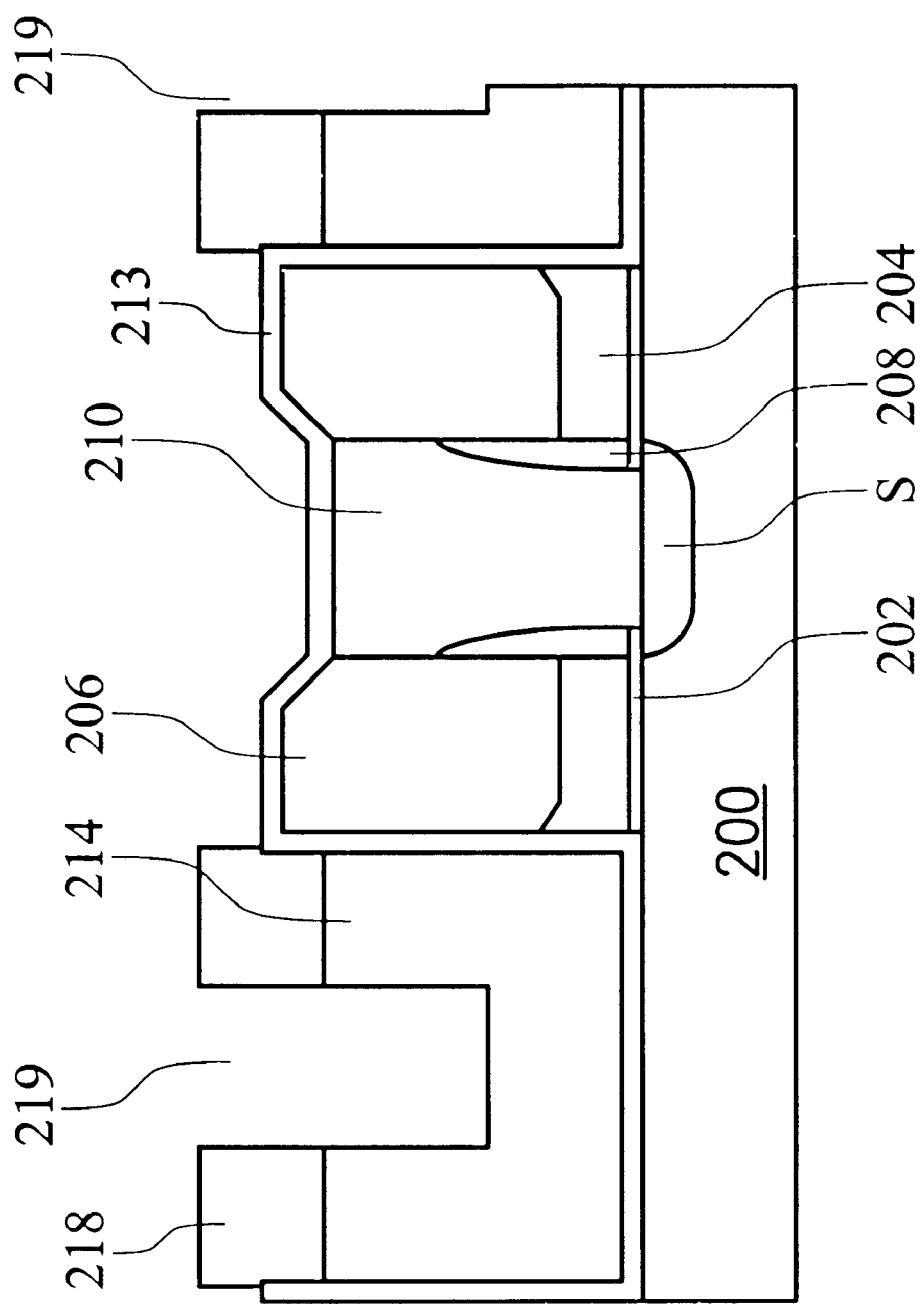

Next, in FIG. 7, the remaining third insulating layer 216 is completely removed by wet etching to form an opening 219 and expose the second conductive layer 214. In the invention, since an etch solution with high etch selectivity to BSG is used, the second insulating layer 213 cannot be overetched, to protect the first insulating layer 206 from damage.

Figure 8:
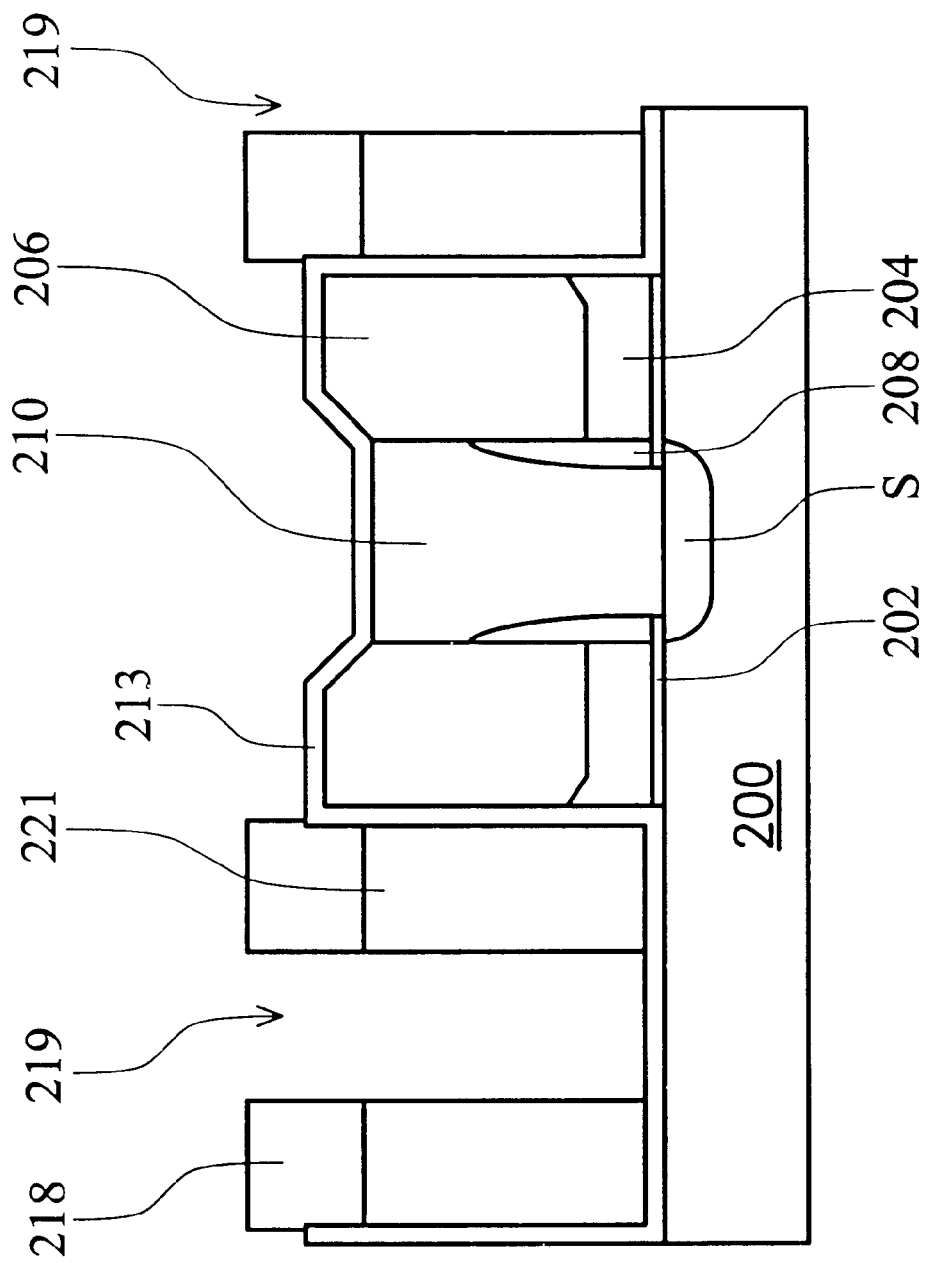

Next, in FIG. 8, the second conductive layer 214 under the opening 219 is removed using the cap layer 218 as a mask to expose the second insulating layer 213. Thereafter, a self-alignment control gate 221 with a "rectangular" profile composed of remaining second conductive layer 214 underlying the cap layer 218 is formed.

Figure 9:
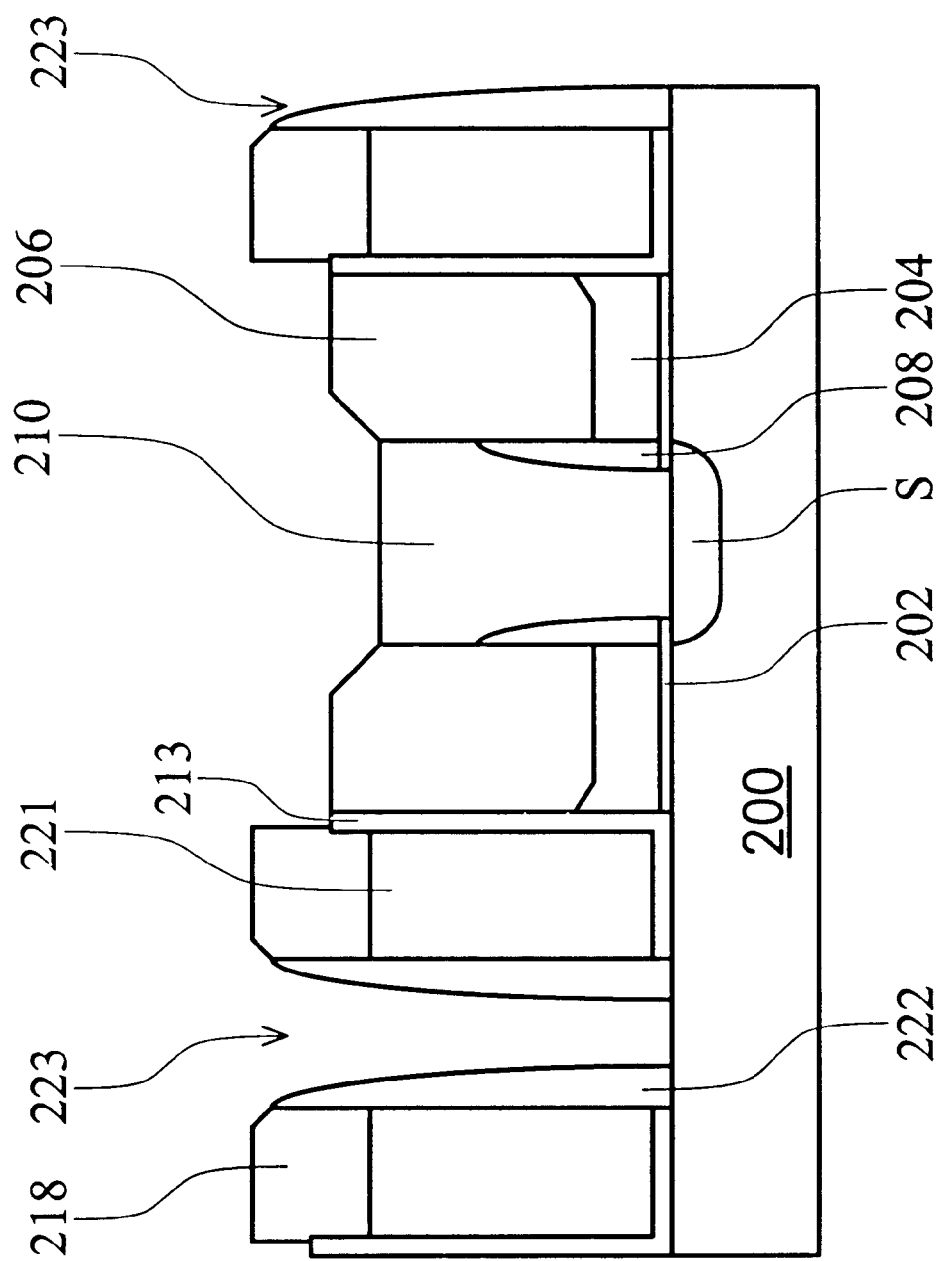

Next, in FIG. 9, the exposed second insulating layer 213 is removed to expose the source line 210, the first insulating layer 206, and the substrate 200 under the opening 219 and form an opening 223. Thereafter, a spacer 222, such as silicon nitride, is formed over the inner wall of the opening 223.

Figure 10:
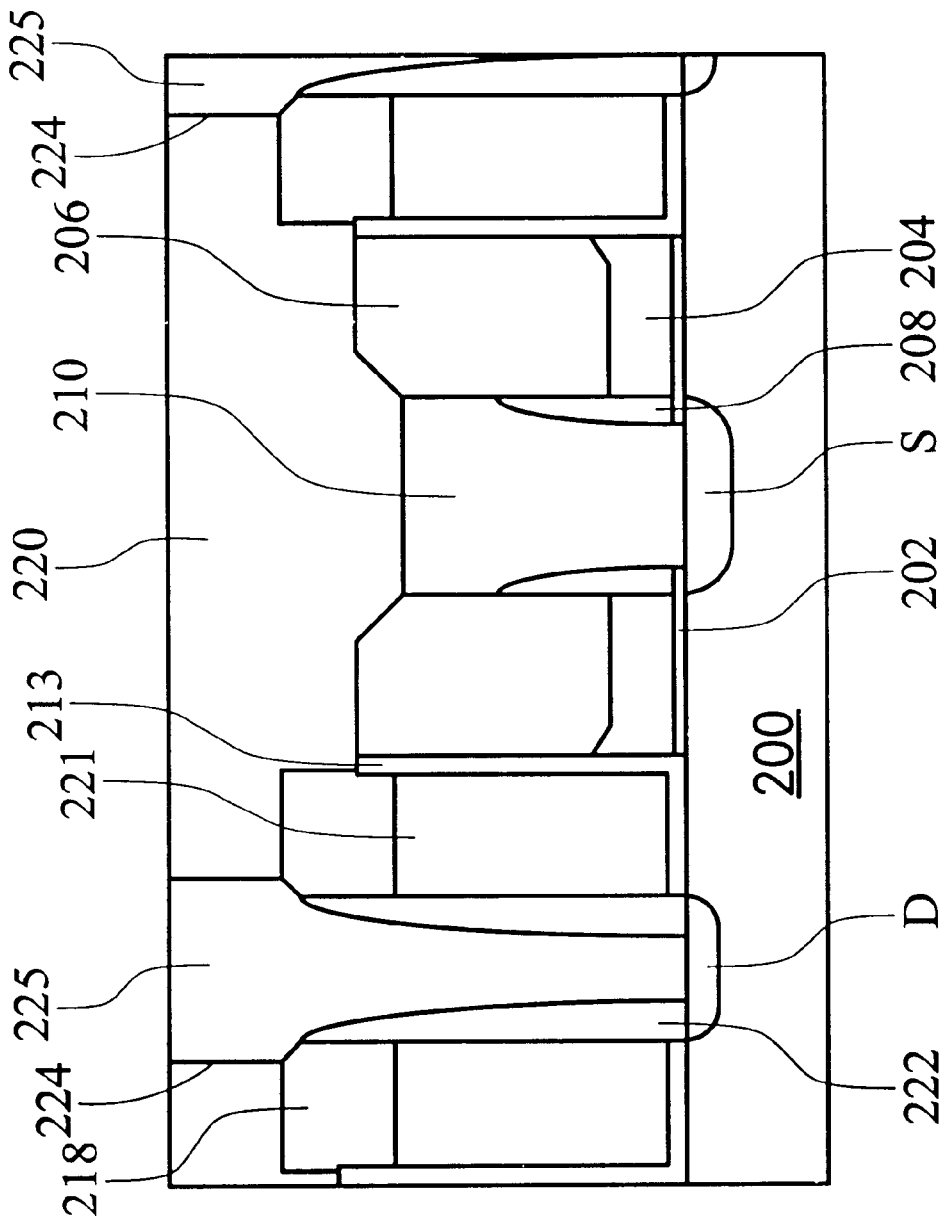

Finally, in FIG. 10, a drain region D is formed in the substrate 200 under the opening 223 by ion implantation. Subsequently, a silicon oxide layer 220 is deposited on the cap layer 218, first insulating layer 206, and source line 210 and fills the opening 223 to serve as interlayer dielectric (ILD). Next, lithography and etching are performed on the silicon oxide layer 220 to form a bit line contact hole 224. Since the cap layer 218 and spacer 222 composed of silicon nitride have high etch selectivity to the silicon oxide layer 220, the control gate 221 can be protected while etching the silicon oxide layer 220 and the self-alignment contact hole 224 can be formed after etching. Thereafter, a metal layer 225 fills the contact hole 224 to serve as a bit line, insulated from the control gate 221 by spacer 222.

According to the present invention, the self-alignment control gate 221 with a rectangular profile can be formed using the cap layer 218 as a mask. Therefore, the critical dimension (CD) of the control gate can be precisely controlled and the fabrication of the flash memory cell can proceed more easily. Moreover, compared to the prior art, the self-alignment contact hole 224 can effectively reduce the interval between the word line (control gate 221) and the bit line 225, thereby increasing the integration of ICs.

FIGS. 11–19 are cross-sections showing the method for fabricating a split gate flash memory cell of the second embodiment. Here, the same reference numerals with the first embodiment indicate similar or identical items.

Figure 11:
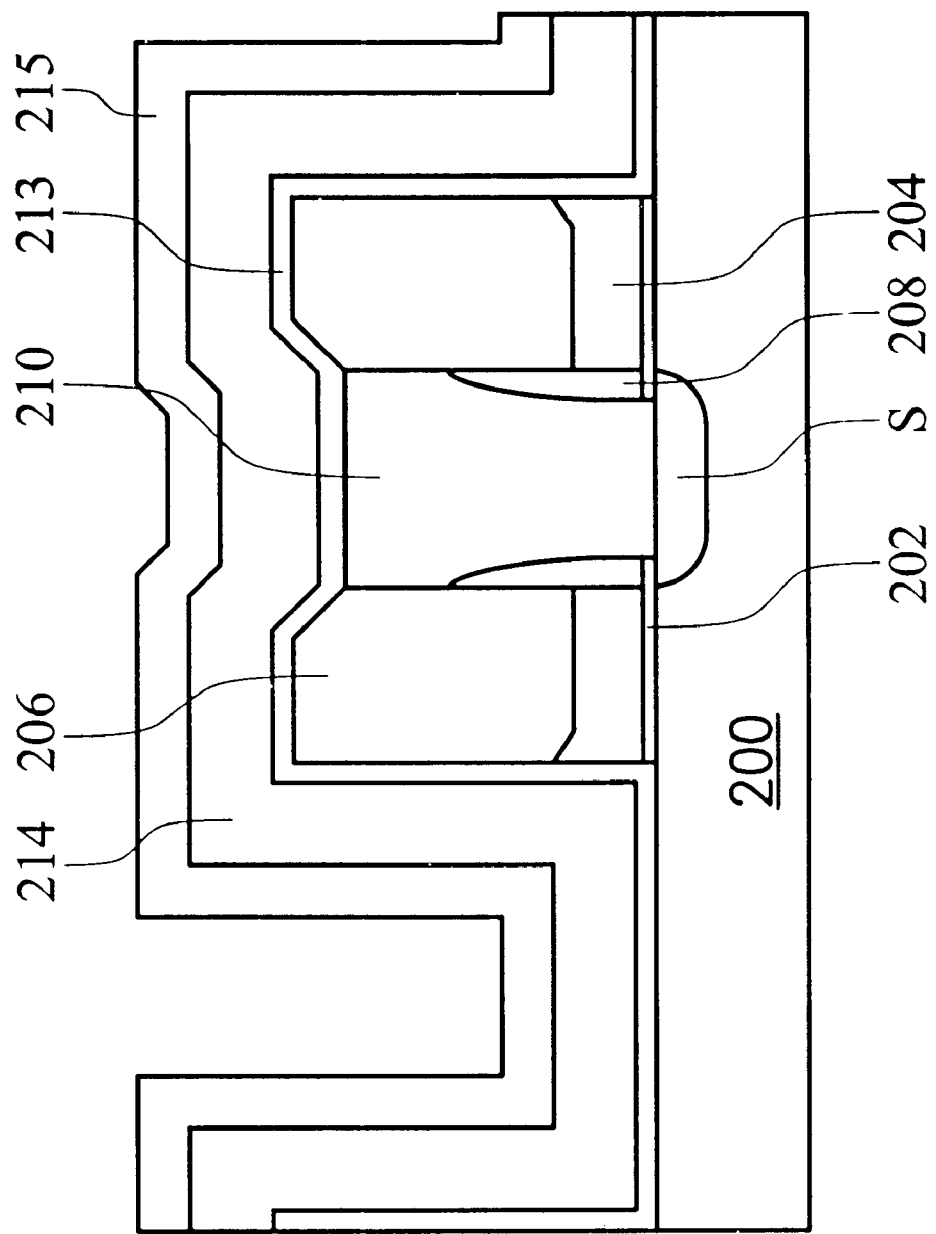
FIGS. 11–19 are cross-sections showing a method for fabricating a split gate flash memory cell according to the second embodiment of the present invention.

In FIG. 11, first, a substrate 200, such as a silicon substrate, having a doped region S serving as a source region, is provided. A first conductive layer 210, such as polysilicon, is formed over the doped region S and serves as a source line to electrically connect with the doped region S. Next, a floating gate 204, such as polysilicon, and a first insulating layer 206, such as silicon oxide formed by tetraethyl orthosilicate (TEOS), are successively formed on the substrate 200 on both sides of the source line 210. The floating gate 204 is respectively insulated from the source line 210 and substrate 200 by the silicon oxide layer 202 and spacer 208. Thereafter, a conformable second insulating layer 213, a conformable conductive layer 214, and a conformable third conductive layer 215 are successively deposited on the substrate 200 and the first insulating layer 206 by conventional deposition, such as CVD. In the invention, the second insulating layer 213 can be high temperature oxide. Moreover, the second conductive layer 214 can be polysilicon with a thickness of about 500~1000 Å and the third conductive layer 215 can be tungsten silicide (WSi) with a thickness of about 300~700 Å.

Figure 12:
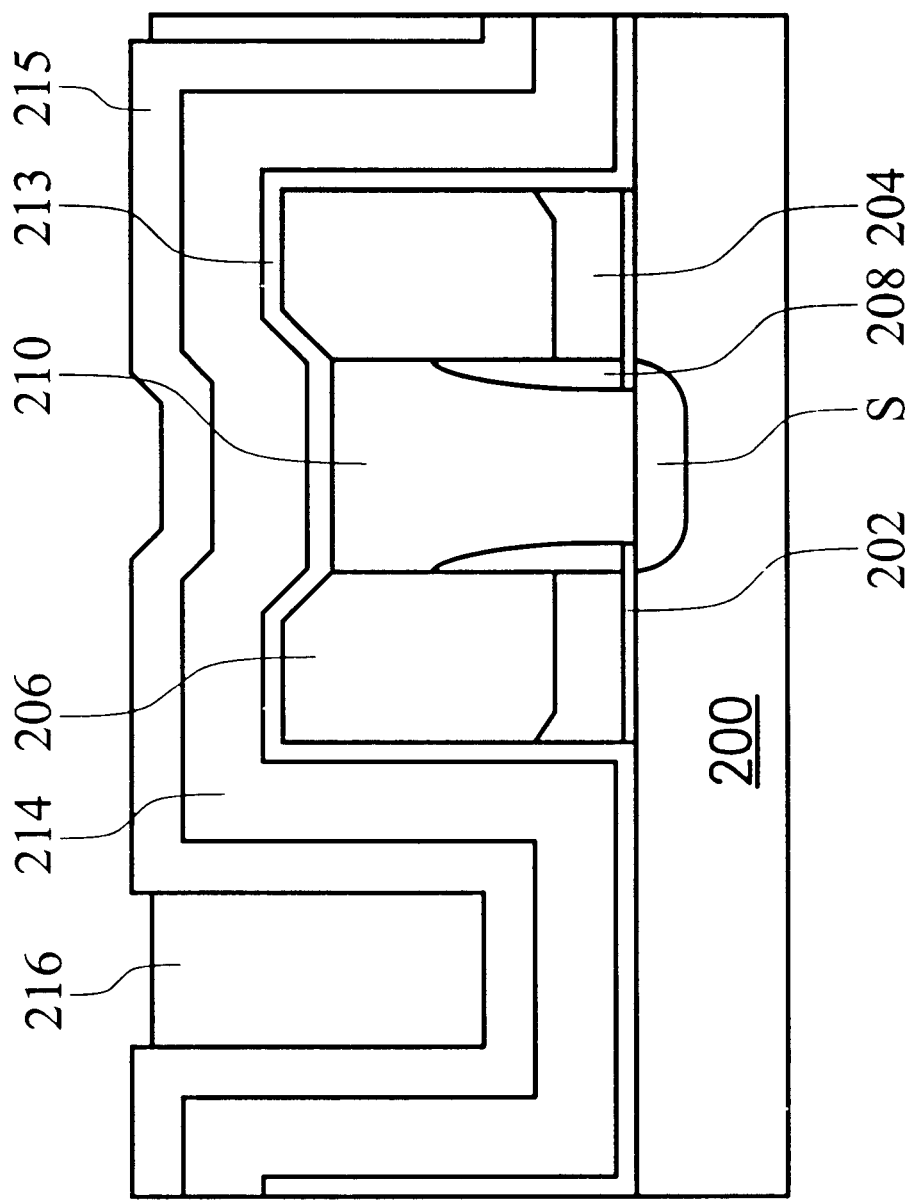

Next, in FIG. 12, a third insulating layer 216, such as borosilicate glass (BSG), is deposited on the third conductive layer 215. The third insulating layer 216 has a thickness of about 2000~4000 Å. Subsequently, the third insulating layer 216 is etched back by dry etching to expose the third conductive layer 215.

Figure 13:
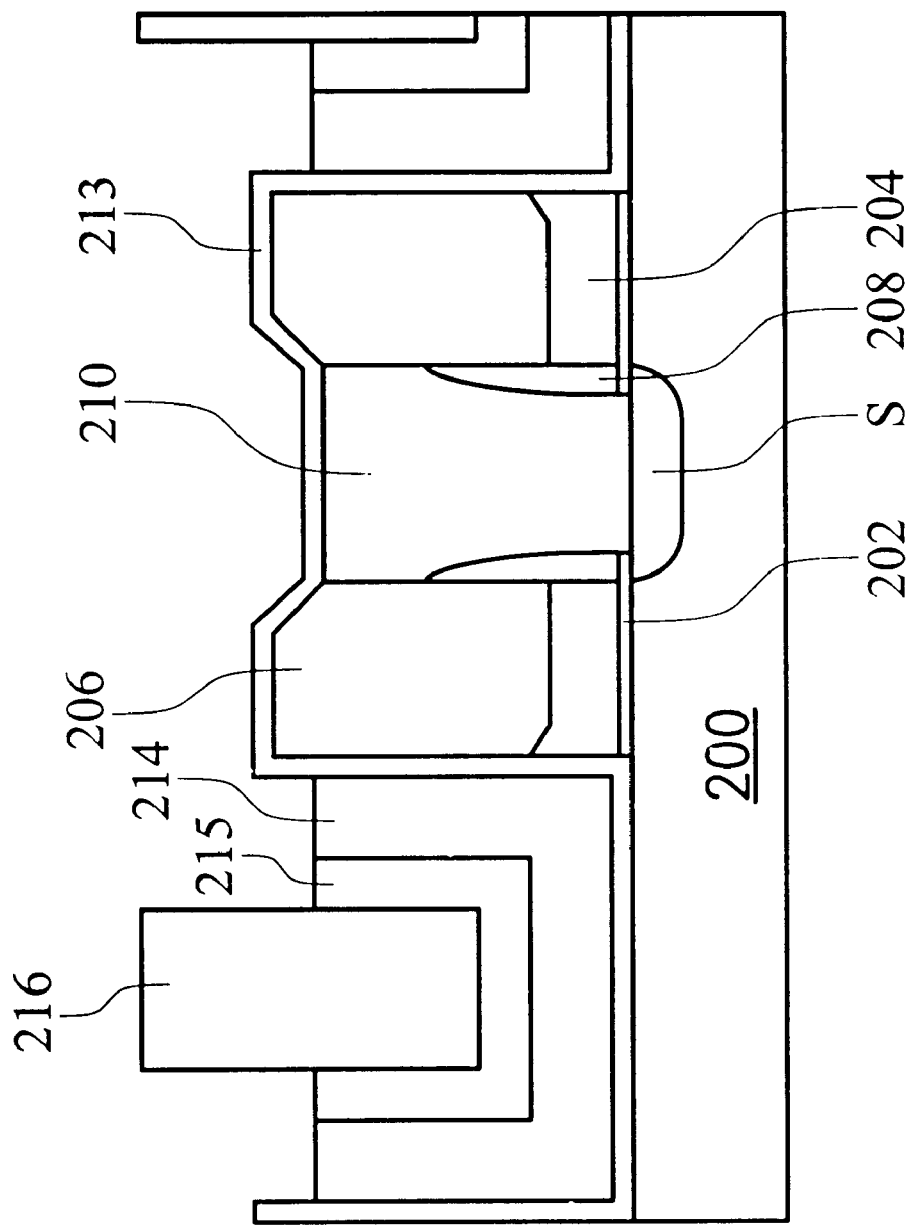

Next, in FIG. 13, the exposed third conductive layer 215 and the underlying second conductive layer 214 are etched back to expose the second insulating layer 213 using the remaining third insulating layer 216 as a hard mask. subsequently, the third and second conductive layers 215, 214 are overetched to lower their top surface below the second insulating layer 213.

Figure 14:
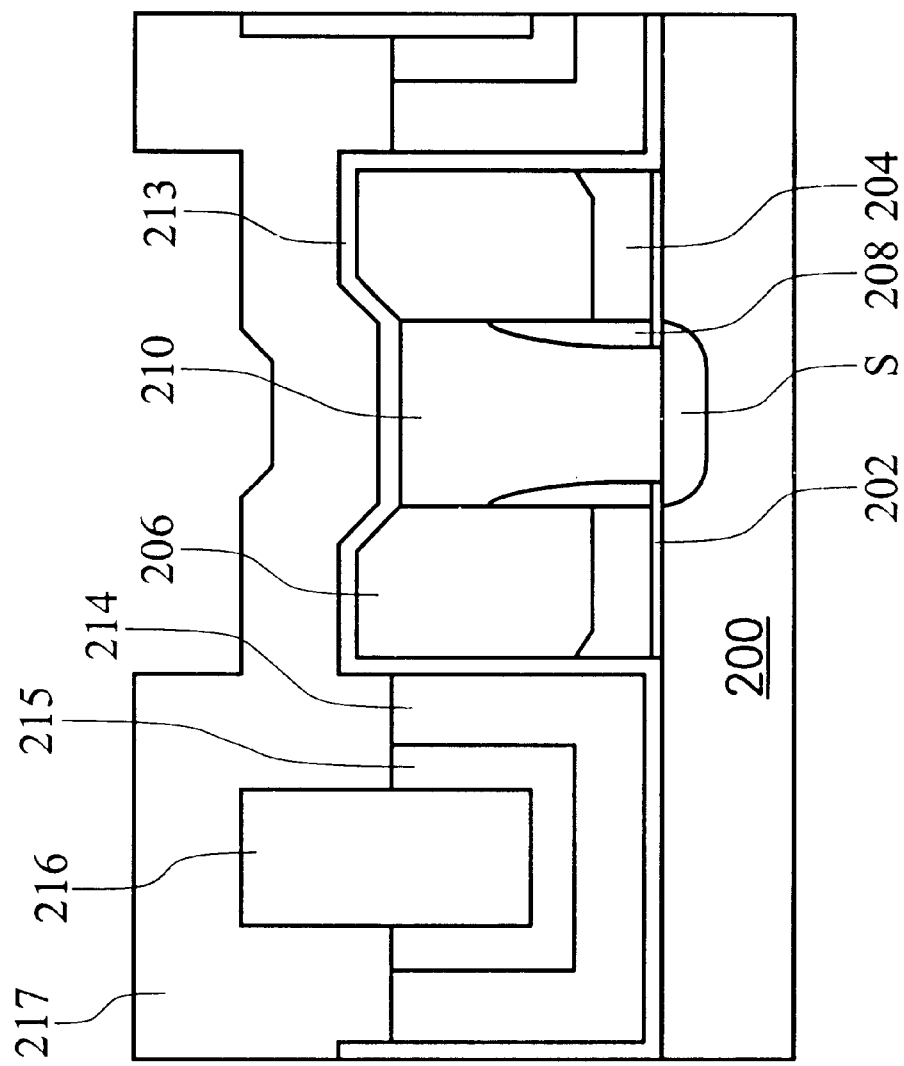

Next, in FIG. 14, a mask layer 217 is deposited on the exposed third and second conductive layers 215, 214 and second insulating layer 213 by CVD. In the invention, the mask layer 217 can be silicon nitride with a thickness of about 1200~1700 Å. In addition, the mask layer 217 deposited on the exposed third and second conductive layers 215, 214 is thicker at about 2500~3400 Å.

Figure 15:
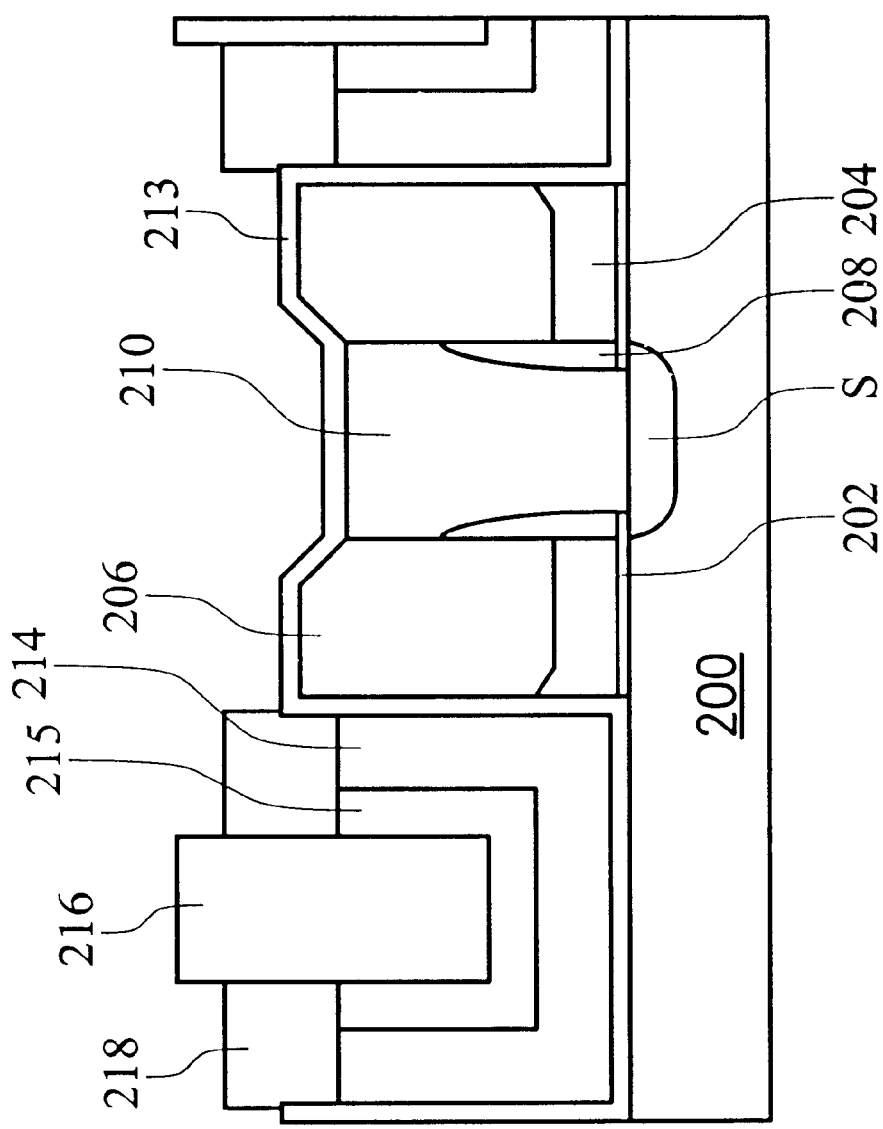

Next, in FIG. 15, the mask layer 217 is etched back to expose the remaining third insulating layer 216 and the second insulating layer 213 to form a cap layer 218 on the third and second conductive layers 215, 214.

Figure 16:
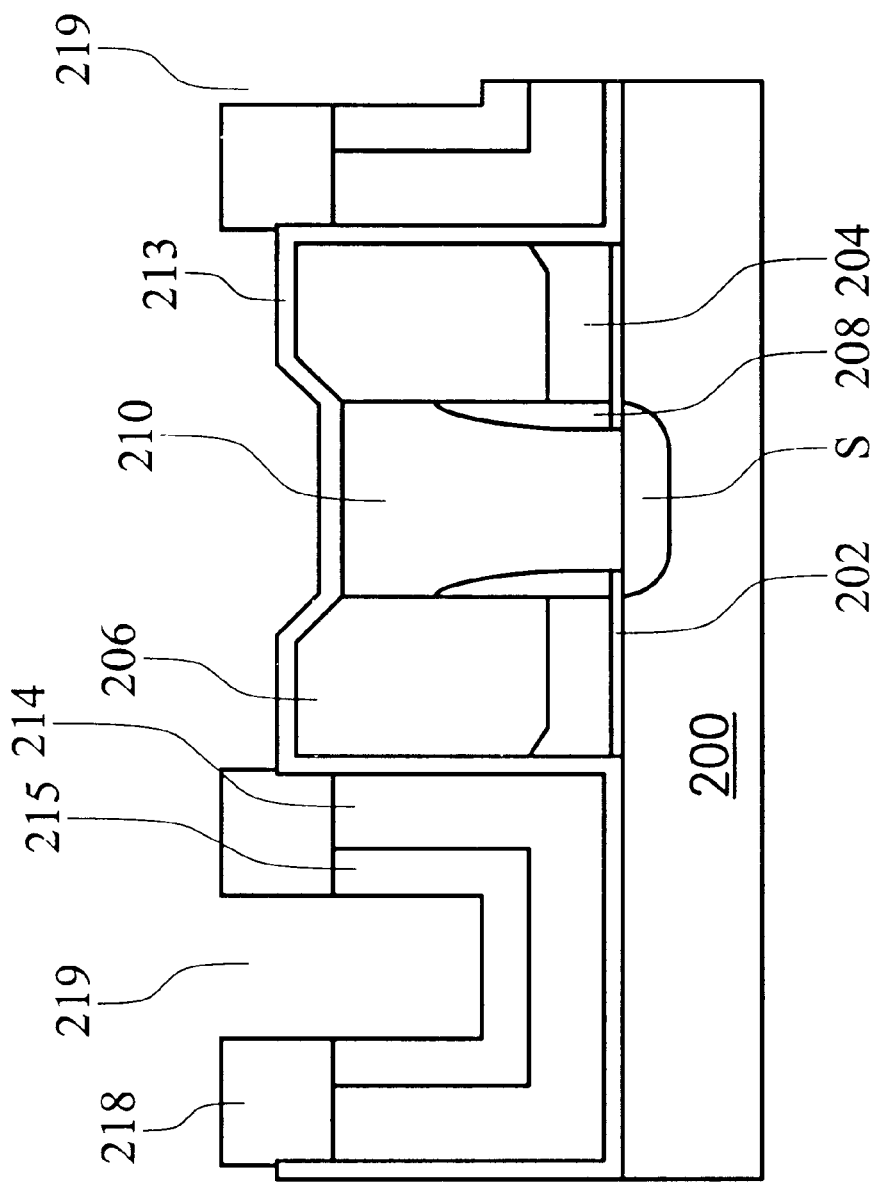

Next, in FIG. 16, the remaining third insulating layer 216 is completely removed by wet etching to form an opening 219 and expose the third conductive layer 215. In the invention, since an etch solution with high etch selectivity to BSG is used, the second insulating layer 213 cannot be overetched, to protect the first insulating layer 206 from damage.

Figure 17:
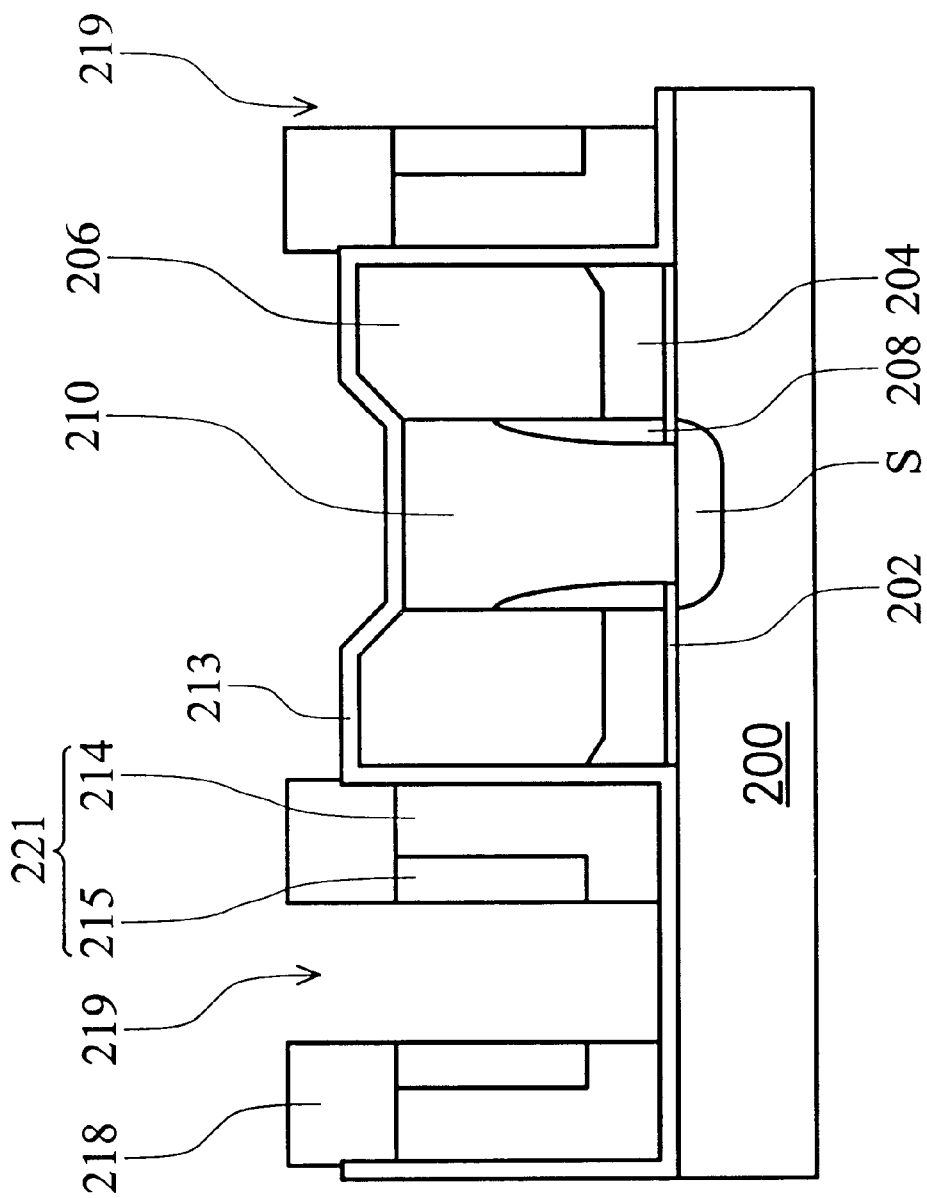

Next, in FIG. 17, the third and second conductive layers 215, 214 under the opening 219 are removed using the cap layer 218 as a mask to expose the second insulating layer 213. Thereafter, a self-alignment control gate 221 with a "rectangular" profile composed of remaining third and second conductive layers 215, 214 underlying the cap layer 218 is formed.

Figure 18:
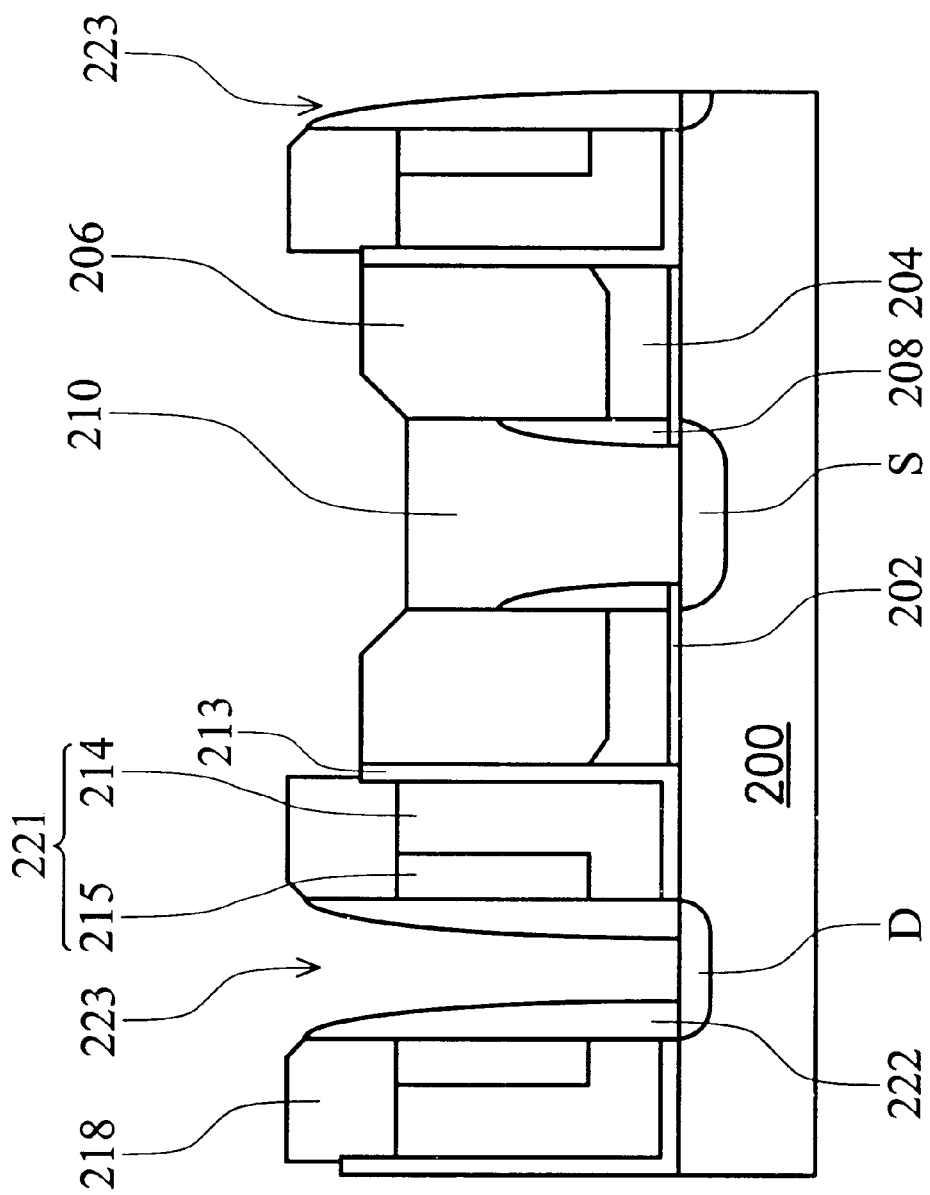

Next, in FIG. 18, the exposed second insulating layer 213 is removed to expose the source line 210, the first insulating layer 206, and the substrate 200 under the opening 219 and form an opening 223. Thereafter, a spacer 222, such as silicon nitride, is formed over the inner wall of the opening 223.

Figure 19:
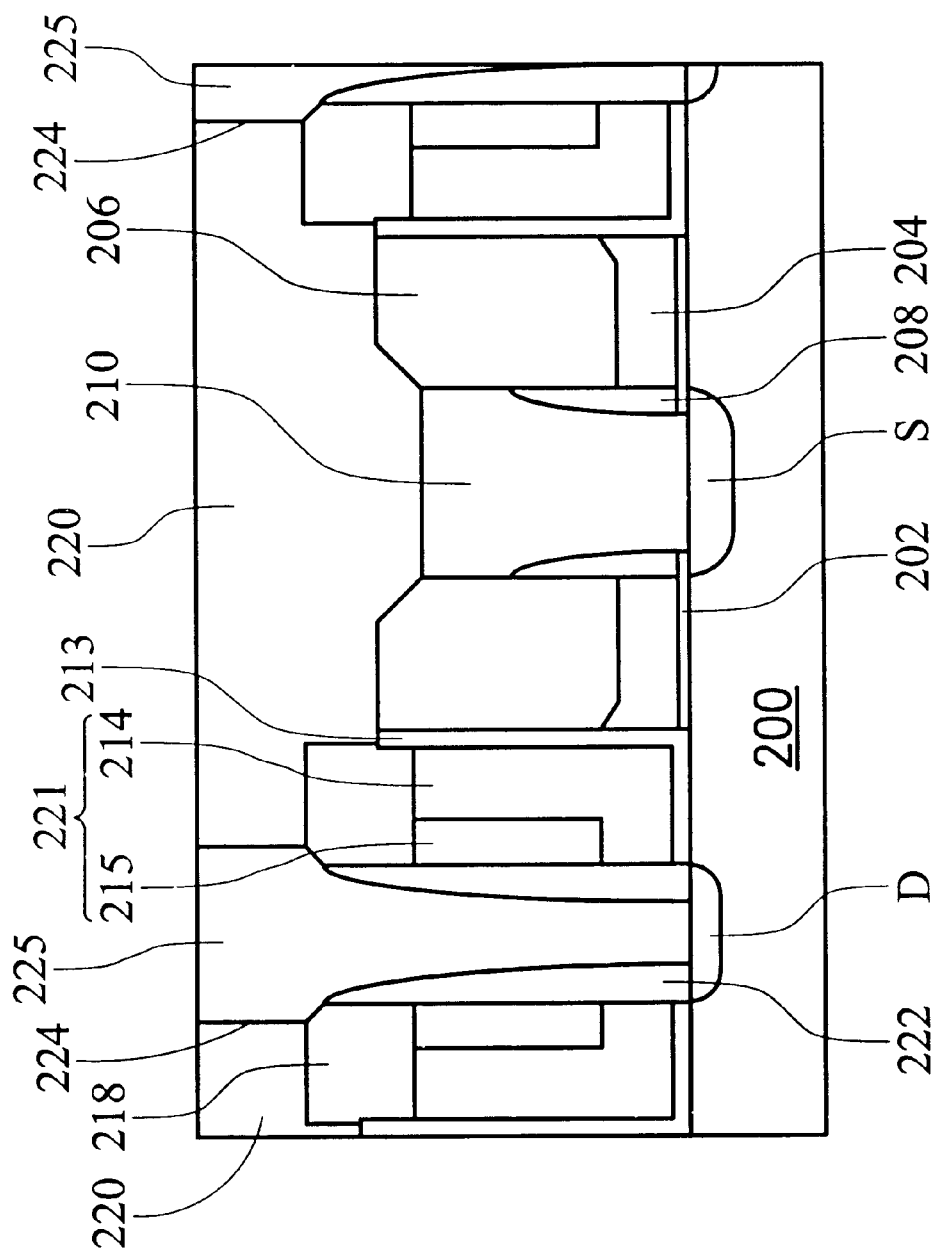

Finally, in FIG. 19, a drain region D is formed by ion implantation in the substrate 200 under the opening 223. Subsequently, a silicon oxide layer 220 is deposited on the cap layer 218, first insulating layer 206, and source line 210 and fills the opening 223 to serve as ILD. Next, lithography and etching are performed on the silicon oxide layer 220 to form a bit line contact hole 224. Since the cap layer 218 and spacer 222 composed of silicon nitride have high etch selectivity to the silicon oxide layer 220, the control gate 221 can be protected while etching the silicon oxide layer 220 and the self-alignment contact hole 224 can be formed after etching. Thereafter, a metal layer 225 fills the contact hole 224 to serve as a bit line, insulated from the control gate 221 by spacer 222.

According to this embodiment, advantages mentioned in the first embodiment can again be obtained. Moreover, since the control gate 221 is composed of tungsten silicide and polysilicon, lower resistance of the control gate can be achieved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a split gate flash memory cell, comprising the steps of:
    providing a substrate having a doped region and a first conductive layer formed over the doped region;
    forming a floating gate and a first insulating layer successively over the substrate on both sides of the first conductive layer, wherein the floating gate is insulated from the first conductive layer and the substrate;
    forming a conformable second insulating layer and a conformable second conductive layer on the substrate and the first insulating layer successively;
    forming a third insulating layer on the second conductive layer;
    etching back the third insulating layer to expose the second conductive layer;
    etching back the exposed second conductive layer to expose the second insulating layer;
    forming a cap layer on the exposed second conductive layer;
    removing the third insulating layer to form an opening and expose the second conductive layer; and
    removing the second conductive layer under the opening to expose the second insulating layer and form a control gate composed of the remaining second conductive layer underlying the cap layer.

2. The method as claimed in claim 1, further comprising the steps of:
    removing the second insulating layer under the opening to expose the substrate and form a contact hole; and
    forming a metal layer in the contact hole and insulated from the control gate.

3. The method as claimed in claim 2, wherein the metal layer serves as a bit line.

4. The method as claimed in claim 1, wherein the substrate is silicon.

5. The method as claimed in claim 1, wherein the doped region is a source region.

6. The method as claimed in claim 1, wherein the first conductive layer serves as a source line.

7. The method as claimed in claim 1, wherein the first conductive layer, the floating gate, and the second conductive layer are polysilicon.

8. A method as claimed in claim 1, wherein the first insulating layer is silicon oxide formed by tetraethyl orthosilicate (TEOS).

9. The method as claimed in claim 1, wherein the second insulating layer is high temperature oxide.

10. The method as claimed in claim 1, wherein the third insulating layer is borosilicate glass.

11. The method as claimed in claim 1, wherein the cap layer is silicon nitride.

12. The method as claimed in claim 1, wherein the profile of the control gate is rectangular.

13. A method for fabricating a split gate flash memory cell, comprising the steps of:
    providing a substrate having a doped region and a first conductive layer formed over the doped region;
    forming a floating gate and a first insulating layer successively over the substrate on both sides of the first conductive layer, wherein the floating gate is insulated from the first conductive layer and the substrate;
    forming a conformable second insulating layer, a conformable second conductive layer, and a third conductive layer on the substrate and the first insulating layer successively;
    forming a third insulating layer on the third conductive layer;
    etching back the third insulating layer to expose the third conductive layer;
    etching back the exposed third conductive layer and the second conductive layer successively to expose the second insulating layer;
    forming a cap layer on the exposed third and second conductive layers;
    removing the third insulating layer to form an opening and expose the third conductive layer; and
    removing the third and second conductive layers under the opening to expose the second insulating layer and form a control gate composed of the remaining third and second conductive layers underlying the cap layer.

14. The method as claimed in claim 13, further comprising the steps of:

removing the second insulating layer under the opening to expose the substrate and form a contact hole; and forming a metal layer in the contact hole, insulated from the control gate.

15. The method as claimed in claim 14, wherein the metal layer serves as a bit line.

16. The method as claimed in claim 13, wherein the substrate is silicon.

17. The method as claimed in claim 13, wherein the doped region is a source region.

18. The method as claimed in claim 13, wherein the first conductive layer serves as a source line.

19. The method as claimed in claim 13, wherein the first conductive layer, the floating gate, and the second conductive layer are polysilicon.

20. The method as claimed in claim 13, wherein the third conductive layer is tungsten silicide.

21. A method as claimed in claim 13, wherein the first insulating layer is silicon oxide formed by tetraethyl orthosilicate (TEOS).

22. The method as claimed in claim 13, wherein the second insulating layer is high temperature oxide.

23. The method as claimed in claim 13, wherein the third insulating layer is borosilicate glass.

24. The method as claimed in claim 13, wherein the cap layer is silicon nitride.

25. The method as claimed in claim 13, wherein the profile of the control gate is rectangular.

* * * * *